US009203253B2

(12) United States Patent
Nomoto (10) Patent No.: US 9,203,253 B2
(45) Date of Patent: Dec. 1, 2015

(54) CHARGE ACCEPTANCE LIMIT DETERMINATION APPARATUS AND CHARGE ACCEPTANCE LIMIT DETERMINATION METHOD

(71) Applicants:Furukawa Electric Co., Ltd., Tokyo (JP); Furukawa Automotive Systems Inc., Shiga (JP)

(72) Inventor: Shinichi Nomoto, Tokyo (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 380 days.

(21) Appl. No.: 13/769,659

(22) Filed: Feb. 18, 2013

(65) Prior Publication Data

US 2013/0154574 A1 Jun. 20, 2013

Related U.S. Application Data

(63) Continuation of application No. PCT/JP2011/071438, filed on Sep. 21, 2011.

(30) Foreign Application Priority Data

Sep. 24, 2010 (JP) ................................ 2010-213842

(51) Int. Cl.
*H01M 10/44* (2006.01)
*H01M 10/46* (2006.01)
(Continued)

(52) U.S. Cl.
CPC ........... *H02J 7/0052* (2013.01); *G01R 31/3624* (2013.01);
(Continued)

(58) Field of Classification Search
CPC ..... H02J 7/0021; H02J 7/0026; H02J 7/0047; H02J 2007/005
USPC .......... 320/132, 148; 324/426, 427, 430, 433; 340/636.1, 636.11, 636.12, 636.13
See application file for complete search history.

(56) References Cited

U.S. PATENT DOCUMENTS 7,554,296 B2 * 6/2009 Mizuno et al. ................ 320/132
2006/0271316 A1 11/2006 Ahmed et al.

FOREIGN PATENT DOCUMENTS

| CN | 1812220 A | 8/2006 |
| CN | 101833068 A | 9/2010 |
| JP | 2001-016800 A | 1/2001 |
| JP | 2001-157377 A | 6/2001 |
| JP | 2004-361253 A | 12/2004 |
| JP | 2006-220616 A | 8/2006 |

OTHER PUBLICATIONS

Chinese Patent Application No. 201180044172.3, Office Action dated Jul. 2, 2014.
(Continued)

*Primary Examiner* — Edward Tso
(74) *Attorney, Agent, or Firm* — Thompson Coburn LLP (57) ABSTRACT

A charge acceptance limit determination apparatus includes a voltage measuring unit that measures a voltage of a secondary battery, a current measuring unit that measures an electric current flowing through the secondary battery, and a determining unit that determines whether or not the secondary battery has reached a charge acceptance limit in accordance with a position on a current-voltage plane of a voltage value and a current value that are measured by the voltage measuring unit and the current measuring unit.

18 Claims, 9 Drawing Sheets

(51) Int. Cl.
*H02J 7/00* (2006.01)
*H01M 10/48* (2006.01)
*G01R 31/36* (2006.01)

(52) U.S. Cl.
CPC ........... *H01M 10/48* (2013.01); *G01R 31/3651* (2013.01); *G01R 31/3662* (2013.01); *G01R 31/3679* (2013.01); *H02J 7/0047* (2013.01); *H02J 2007/005* (2013.01)

(56) References Cited

OTHER PUBLICATIONS

International Search Report and Written Opinion for PCT/JP2011/071438 dated Dec. 27, 2011.
Office Action received on May 11, 2015 in a corresponding Japanese patent application No. 2012-535046 and its English translation.

* cited by examiner

CHARGE ACCEPTANCE LIMIT DETERMINATION APPARATUS AND CHARGE ACCEPTANCE LIMIT DETERMINATION METHOD

CROSS-REFERENCE TO RELATED APPLICATION

This is a continuation application of International Patent Application No. PCT/JP2011/071438, filed Sep. 21, 2011, which claims the benefit of Japanese Patent Application No. 2010-213842 filed Sep. 24, 2010, the contents of both of which are incorporated by reference herein in its entirety.

BACKGROUND OF INVENTION

1. Field of the Invention

The present invention relates to a charge acceptance limit determination apparatus and a charge acceptance limit determination method.

2. Background of the Invention

Japanese Laid-Open Patent Publication No. 2001-16800 discloses a technique of preventing unnecessary power generation by controlling power generation of an alternator based on a state of charge (SOC) of a secondary battery.

Figure 11:
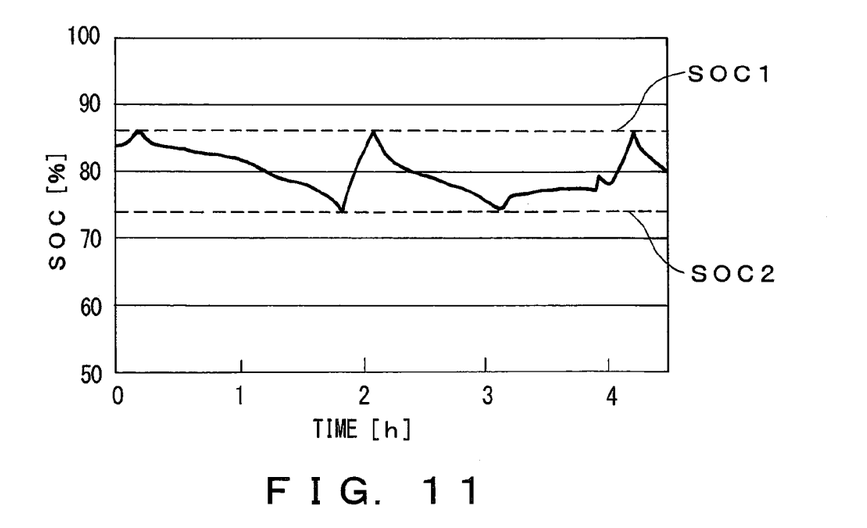
FIG. 11 is a graph showing an example of charge control of the related art.
Figure 12A:
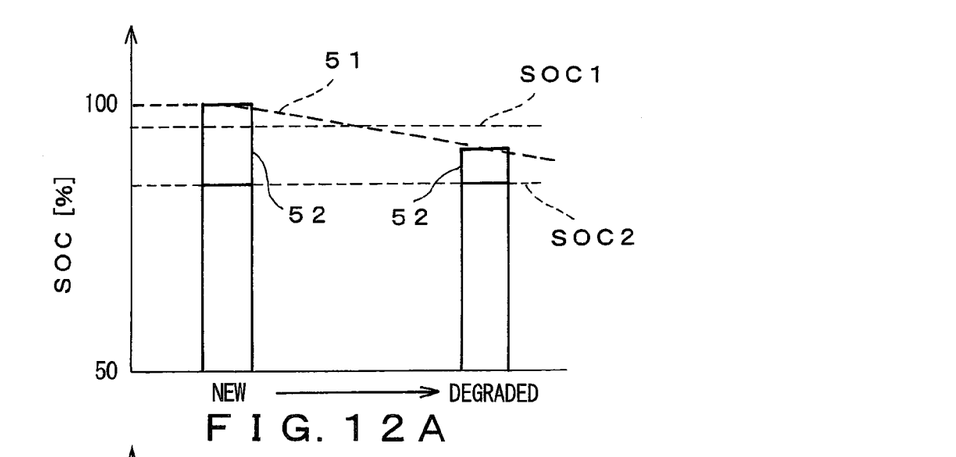
FIGS. 12A to 12C are diagrams showing an example of the charge controlling of the related art.
Figure 12B:
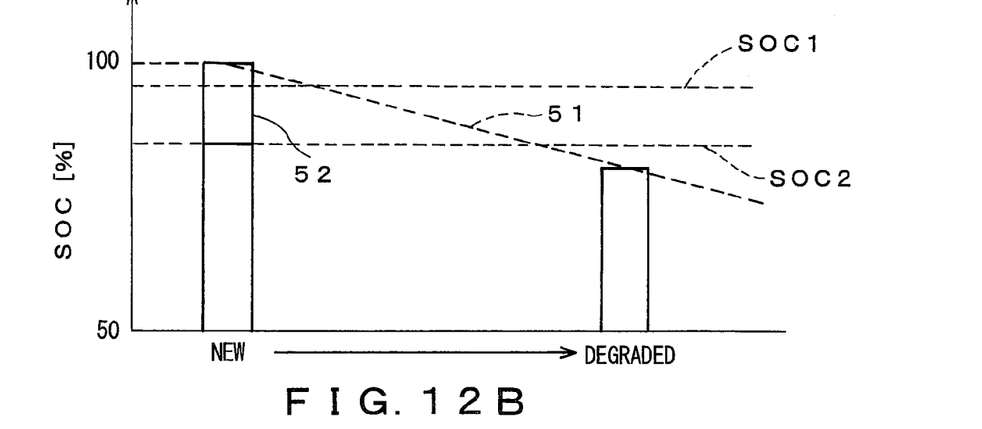
Figure 12C:
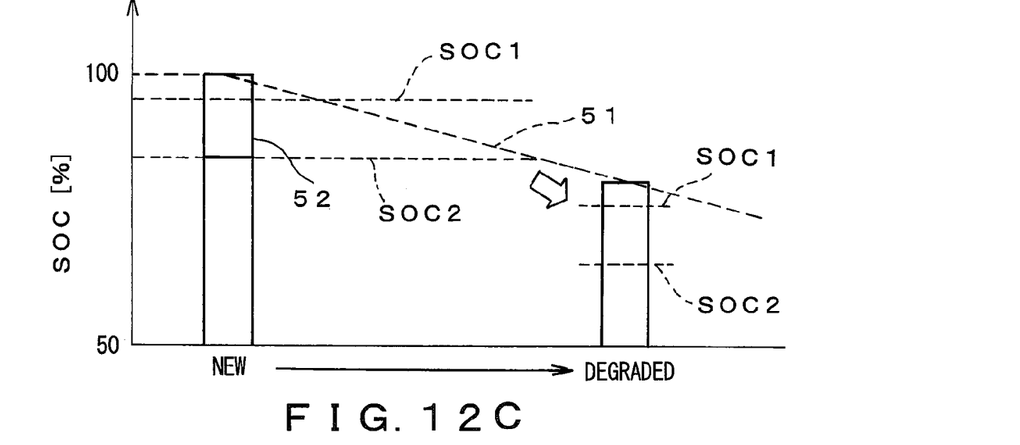

According to the aforementioned control based on the SOC, the control is generally performed in such a manner that the SOC, which is being measured, falls in a predetermined range between SOC2 and SOC1, as shown in FIG. 11. However, it is known that, when a full charge state of a secondary battery when new is defined as SOC=100%, the SOC thus defined changes with an elapse of time (a value decreases). That is to say, as shown in FIG. 12A, an SOC at an upper chargeable limit of the secondary battery, i.e., a charge acceptance limit SOC, decreases as the secondary battery degrades. FIGS. 12A to 12C are diagrams showing aging of the charge acceptance limit SOC of the secondary battery. In these drawings, references numerals 51 and 52 indicate the charge acceptance limit SOC and a chargeable charge control range, respectively.

A decrease in the charge acceptance limit SOC is caused by sulfation (crystals of sulfate) which is built up on electrode plates of the battery and which does not dissolve by being hardened during a long time of use. As the sulfation which does not dissolve increases on the electrode plates, an area of charge/discharge on the electrode plates decreases and leads to a decrease in the charge acceptance limit SOC.

When the charge acceptance limit SOC decreases as shown in FIG. 12A, the secondary battery cannot be charged to an upper limit SOC1 of a charge control range set in advance, and a charge acceptance limit SOC 51 which is lower than that will become an upper chargeable limit. As a result, the charge control range 52 will be greater than or equal to the lower limit SOC2 and less than or equal to the charge acceptance limit SOC 51, and thus the controllable range becomes narrower.

As the degradation of the secondary battery further progresses, as shown in FIG. 12B, the charge acceptance limit SOC 51 becomes lower than the lower limit SOC2 of the charge control range. In such a state, the charge control range cannot be ensured and the charging of the secondary battery will be always carried out. As a result, fuel consumption of the engine cannot be improved. In order to ensure the charging control range and to carry out charging control even in a state where degradation of the secondary battery has progressed, it is necessary to detect the charge acceptance limit SOC 51 which decreases as the degradation progresses and, based on this, to appropriately adjust the charge control range as shown in FIG. 12C.

The present invention has been contrived to solve the aforementioned problem and an object of the present invention is to provide a charge acceptance limit determination apparatus and a charge acceptance limit determination method for a secondary battery capable of accurately determining the charge acceptance limit of the secondary battery.

SUMMARY OF INVENTION

A charge acceptance limit determination apparatus of an aspect of the invention includes a voltage measuring unit that measures a voltage of a secondary battery, a current measuring unit that measures an electric current flowing through the secondary battery, and a determining unit that determines whether or not the secondary battery has reached a charge acceptance limit in accordance with a position on a current-voltage plane of a voltage value and a current value that are measured by the voltage measuring unit and the current measuring unit.

With such a configuration, a charge acceptance limit of the secondary battery can be determined accurately.

According to another aspect, in addition to the above aspect, the determining unit determines whether or not the secondary battery has reached a charge acceptance limit based on a distance of a position corresponding to the voltage value and the current value from a predetermined base point on the current-voltage plane.

With such a configuration, it is possible to make an easy adjustment to a change in the environment or the like by moving the base point.

According to yet another aspect, in addition to the above aspect, the determining unit obtains, on the current-voltage plane, a midpoint between a position corresponding to the voltage value and the current value that are newly measured and a position corresponding to the voltage value and the current value that have been previously measured, and determines whether or not the secondary battery has reached a charge acceptance limit based on a distance of the midpoint from a predetermined base point.

With such a configuration, even in a case where the voltage value and the current value vary, the charge acceptance limit can be determined accurately by suppressing the variation.

According to still another aspect, in addition to the above aspect, the determining unit determines whether or not the secondary battery has reached a charge acceptance limit based on a distance of the predetermined base point from a midpoint between the previously obtained midpoint and the newly obtained midpoint.

With such a configuration, even in a case where there is a large variation in the voltage value and the current value, the charge acceptance limit can be determined accurately by suppressing the variation.

According to still another aspect, in addition to the above aspect, when the distance is smaller than a predetermined threshold, the determining unit determines that the secondary battery has reached a charge acceptance limit.

With such a configuration, by comparing with the threshold, the charge acceptance limit can be obtained in a facilitated manner.

According to still another aspect, in addition to the above aspect, when a weighted average of the distances is smaller than a predetermined threshold, the determining unit determines that the secondary battery has reached a charge acceptance limit.

With such a configuration, by using a weighted average, the charge acceptance limit can be determined in a simple and accurate manner.

According to still another aspect, in addition to the above aspect, the base point is reset depending on degradation of the secondary battery.

With such a configuration, by resetting of the base point, a simplified handling can be achieved even in a case where the secondary battery has degraded.

According to still another aspect, in addition to the above aspect, the determining unit has a reference value of a voltage value and a reference value of a current value and, when at least one of a measured voltage value and a measured current value is less than or equal to these reference values, the relevant measurement value is excluded from a target of the determination.

With such a configuration, the charge acceptance limit can be determined more accurately by excluding an irregular measurement value when such an irregular measurement value is obtained.

According to still another aspect, in addition to the above aspect, the determining unit has a proper range for a voltage value and a proper range for a current value, and when one of a measured voltage value and a measured current value is out of the proper ranges, the relevant measured value is corrected to a predetermined specified value.

With such a configuration, the charge acceptance limit can be determined more accurately by correcting an irregular measured value to a specified value when such irregular measured value was obtained.

According to still another aspect, in addition to the above aspect, the invention includes a calculating unit that calculates an SOC indicating a state of charge of the secondary battery, and an SOC calculated by the calculation unit when the determining means has determined that the charge acceptance limit has reached is taken as a charge acceptance limit SOC.

With such a configuration, for example, the charge controlling can be performed appropriately, since the charge acceptance limit SOC can be obtained.

According to still another aspect, in addition to the above aspect, after the charge acceptance limit SOC has been set, when an SOC having a value greater than the charge acceptance limit SOC has been calculated by the calculating unit, the charge acceptance limit SOC is updated with the relevant SOC.

With such a configuration, the charge acceptance limit SOC can be corrected even in a case where the charge acceptance limit SOC was falsely set.

Further, a charge acceptance limit determination method of the invention includes measuring a voltage of a secondary battery to obtain a voltage value, measuring an electric current flowing through the secondary battery to obtain a current value, and determining whether or not the secondary battery has reached a charge acceptance limit in accordance with a position on a current-voltage plane of the voltage value and the current value.

With such a method, the charge acceptance limit of the secondary battery can be determined accurately.

According to an aspect of the invention, a charge acceptance limit determination apparatus and a charge acceptance limit determination method can be provided that can accurately determine a charge acceptance limit of a secondary battery.

Further features of the present invention will become apparent from the following detailed description of exemplary embodiments with reference to the attached drawings.

DETAILED DESCRIPTION

Hereinafter, embodiments of the present invention will be described. In the following description, an operation principle of the present invention will be described with reference to the principle diagram shown in FIG. 1 and, thereafter, embodiments will be described.

(A) Explanation of the Principle Diagram

Figure 1:
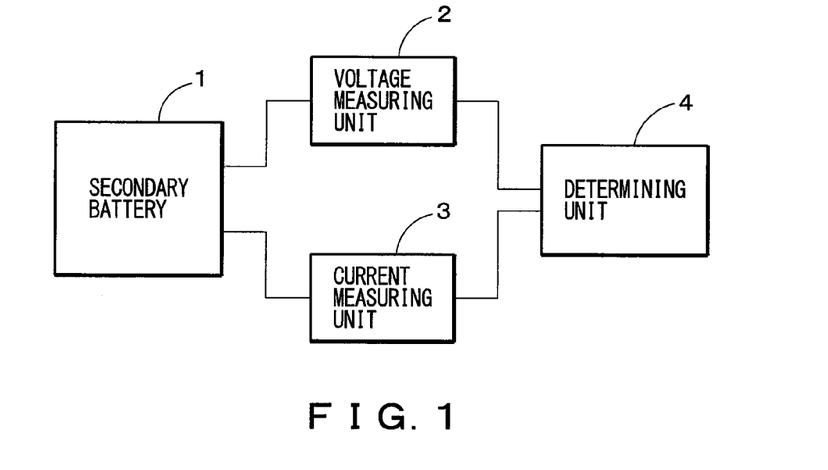
FIG. 1 is a principle diagram for explaining an operation principle of the invention.

FIG. 1 is a principle diagram for explaining an operation principle of the invention. As shown in FIG. 1, the charge acceptance limit determination apparatus of the present invention includes a voltage measuring unit 2, a current measuring unit 3 and a determining unit 4, and determines whether or not a secondary battery 1 has reached a "charge acceptance limit" which is a limit that no more charge can be accepted.

The secondary battery 1 is, for example, comprised of a lead battery or the like. The voltage measuring unit 2 measures a terminal voltage of the secondary battery 1 and gives notice to the determining unit 4. The current measuring unit 3 measures an electric current (a charging current and a discharging current) flowing through the secondary battery 1 and gives notice to the determining unit 4. The determining unit 4 plots, on a current-voltage plane, a voltage value measured by the voltage measuring unit 2 and a current value measured by the current measuring unit 3, and determines whether or not the secondary battery 1 has reached the charge acceptance limit based on a position of the plotted point. Herein, "to plot on a current-voltage plane" not only means to depict a point on an actual plane, but also means, for example, to virtually depict on a storage space such as a memory (to determine a position), to specify data corresponding to any current value and a voltage value in a storage table (e.g., an array, etc.) in which a predetermine data can be obtained by specifying any two values, and to determine values corresponding to the voltage V and the current I in function f(V, I).

(B) Explanation of Operation of Principle Diagram

Figure 2:
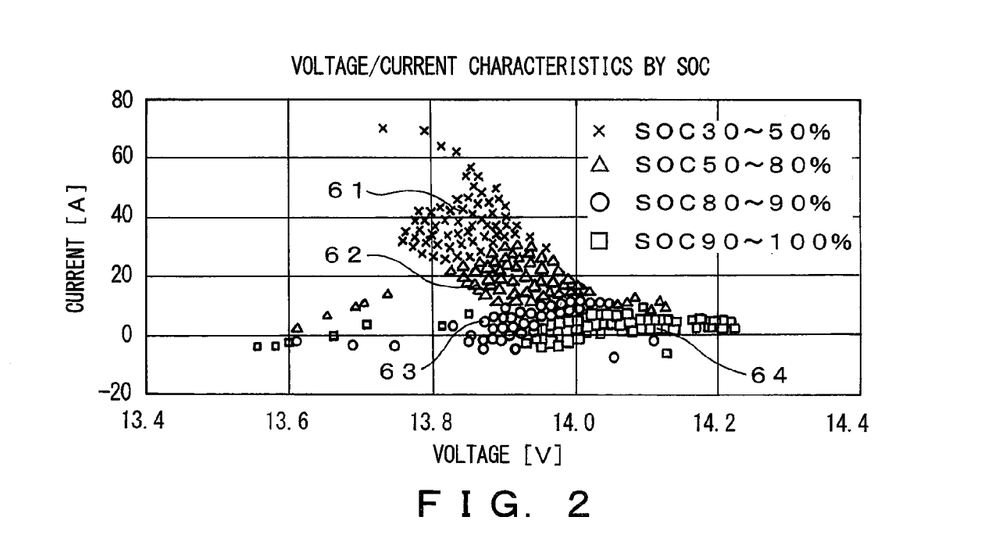
FIG. 2 is a diagram for explaining an operation regarding the principle diagram shown in FIG. 1.

Now, referring to FIG. 2, the operation principle of the invention will be described. Here, FIG. 2 is a plot of the voltage and the current on a current-voltage plane for a case where the charging is performed in a range where the SOC (State of Charge) of the secondary battery 1 varies from 30% to 100%. In this example, points plotted in a region 61 correspond to a range where the SOC is between 30% and 50%, points plotted in a region 62 correspond to a range where the SOC is between 50% and 80%, points plotted in a region 63 correspond to a range where the SOC is between 80% and 90%, and points plotted in a region 64 correspond to a range where the SOC is between 90% and 100%. As can be seen in FIG. 2, as the SOC becomes greater and approaches the charge acceptance limit, there is a tendency that the voltage becomes greater than or equal to 14V and the current becomes less than or equal to 10 A. Also, the region to be plotted differs depending on the value of the SOC.

It is to be noted that there are two definitions for SOC. First is a definition in which a full charge state of a secondary battery when new is taken as 100% and the SOC in the full charge state decreases from 100% depending on the degradation. In such a case, when degraded, the SOC will not become 100% even when fully charged. Second is a definition in which a value that only takes an amount of charging into consideration, and excluding an amount of degradation, is taken as the SOC. In such a case, irrespective of the degree of degradation, the fully charged state is always taken as SOC=100%. Herein, the first definition is used for the SOC.

Figure 3A:
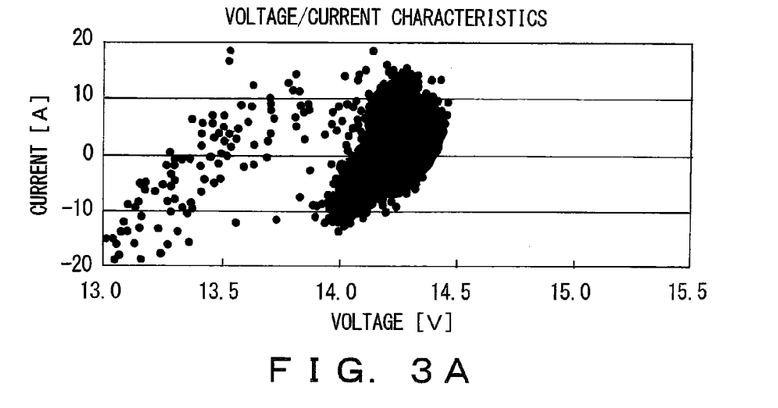
FIGS. 3A to 3C are diagrams for explaining an operation regarding the principle diagram shown in FIG. 1.

FIG. 3A is a diagram in which a voltage of the secondary battery 1 and an electric current flowing through the secondary battery 1 in a state near the charge acceptance limit are plotted on a current-voltage plane. As shown in FIG. 3A, with the secondary battery 1 near the charge acceptance limit, the density of points plotted in a range between 14.0 V and 14.5 V and in a range between −10 A and +10 A is high. In this manner, determination of whether or not being the charge acceptance limit can be made depending on where on the current-voltage plane the points are plotted.

Figure 3B:
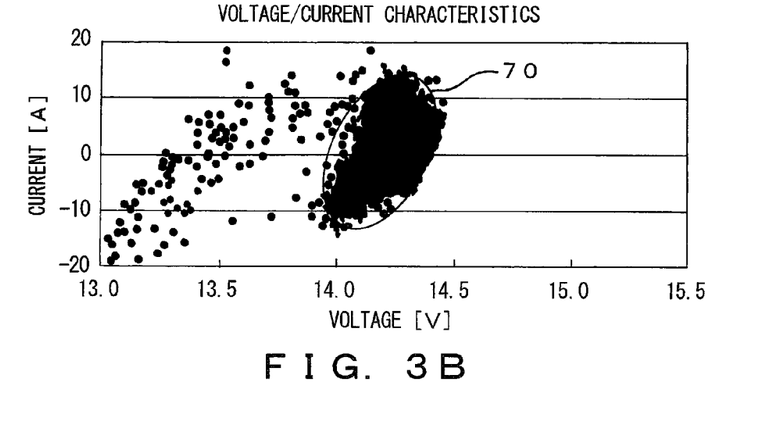

According to the invention, the voltage and the electric current of the secondary battery 1 measured with the voltage measuring unit 2 and the current measuring unit 3 are plotted on the current-voltage plane, and, for example, when the plotted points are plotted in a region 70 enclosed by a curved line shown in FIG. 3B with a high frequency, it can be determined as the charge acceptance limit. In this manner, by making a determination based on the positions of the points plotted on the current-voltage plane, the charge acceptance limit can be detected with a high accuracy. Also, since the voltage and the current of the secondary battery 1 change continually due to fluctuation of a load connected thereto or due to fluctuation of the power generator, it is preferable to make a determination from a statistical point of view based on the results of a plurality of times of plots to determine the charge acceptance limit accurately. In other words, among the plurality of times of plots, it can be determined as being the charge acceptance limit in a case, for example, when 60% or more is within a predetermined region.

Figure 3C:
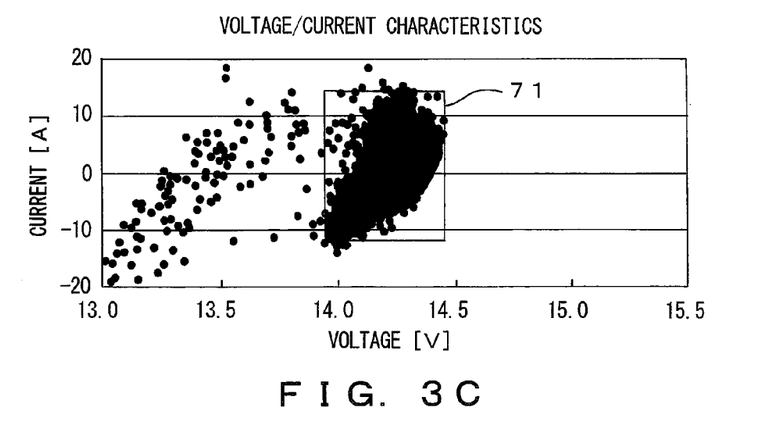

In the case of FIG. 3B, the determination is made based on whether plotted in an elliptical region 70 or not, but since the determination of whether or not enclosed in the ellipse is complicated, for example, as shown in FIG. 3D, the determination can be made by whether or not plotted in a rectangular region 71. With such a method, a determination process can be simplified, since whether or not included can be determined by comparison with threshold values corresponding to four sides.

In the aforementioned principle diagrams, description was made by taking an example in which the regions 70 and 71 are fixed, but it is generally known that the charge acceptance limit SOC gradually decreases due to aging. Accordingly, the regions 70 and 71 may be moved towards the left hand side in the drawings in accordance with an elapse of time. Also, rather than plotting on the current-voltage plane, it is possible to prepare a table in which the current value and the voltage value are stored in association with information indicating whether inside or outside the region, and to determine whether or not it is the charge acceptance limit based on this table. As a method of dealing with aging for a case where a table is used, for example, a plurality of tables corresponding to aging may be prepared and a table corresponding to an elapse of time can be selected. Alternatively, it is possible to provide a single table and to retrieve a corresponding value from the table after having normalized the current value and the voltage value, and to change a normalization parameter in accordance with an elapse of time.

(C) Description of Configuration of the Embodiment

Figure 4:
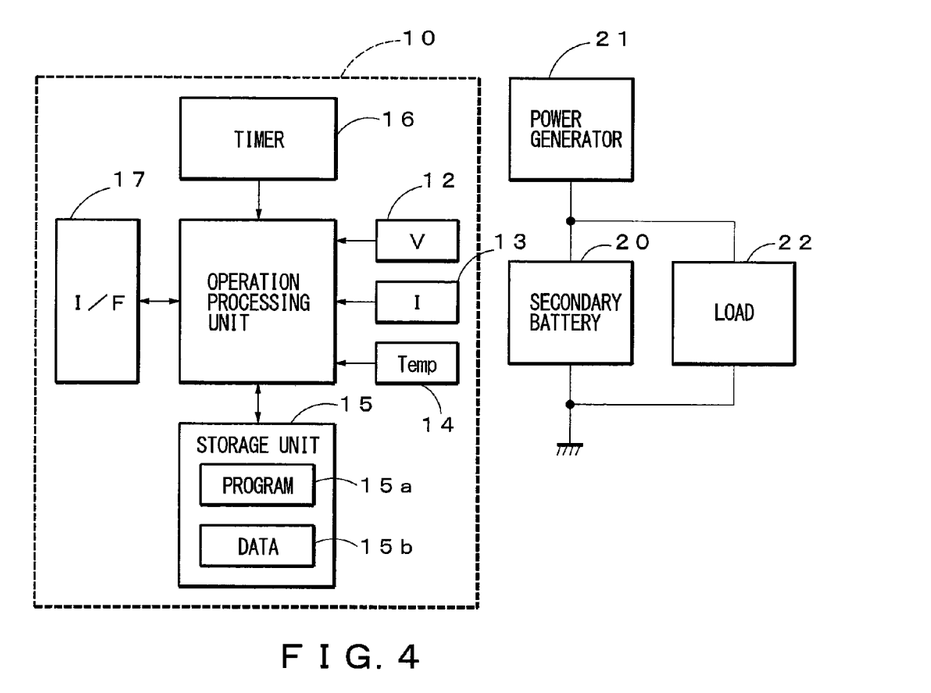
FIG. 4 is an illustrative configuration of an embodiment of the invention.

FIG. 4 is a diagram illustrating an exemplary configuration of a charge acceptance limit determination apparatus of the present embodiment. As shown in this figure, the charge acceptance limit determination apparatus 10 of the present invention includes an operation processing unit 11, a voltage sensor 12, a current sensor 13, a temperature sensor 14, a storage unit 15, a timer 16, and an I/F (Interface) 17 as its main constituent elements, determines whether or not the secondary battery 20 has reached the charge acceptance limit. In an example shown in FIG. 4, a power generator 21 for charging is connected in series to the secondary battery 20 and is connected in parallel to a load 22.

The operation processing unit 11 executes various operation processes based on a program 15*a* and data 15*b* that are stored in the storage unit 15. The voltage sensor 12 measures a terminal voltage of the secondary battery 20 and outputs to the operation processing unit 11. The current sensor 13 measures a charging current (an electric current flowing from the power generator 21) and a discharge current (an electric current flowing to the load 22) of the secondary battery 20 and outputs to the operation processing unit 11. In the following description, the charging current is expressed as "positive" and the discharge current is expressed as "negative".

The temperature sensor 14 measures a temperature of the secondary battery 20 itself or its ambient temperature and outputs to the operation processing unit 11. The storage unit 15 is, for example, comprised of a semiconductor memory such as a ROM (Read Only Memory) and a RAM (Random Access Memory) and stores a program 15*a* and data 15*b*, and also operates as a working area when the operation processing unit 11 executes the program 15*a*. It is to be noted that the program 15*a* includes a program for causing the operation processing unit 11 to execute a process described below. The data 15*b* has data necessary for executing the process described below.

The timer 16 generates time information and supplies it to the operation processing unit 11. The I/F 17 converts a data expression format upon delivering and receiving data to and from an external device, not shown.

(D) Explanation of Operation of Embodiment

Next, an operation of an embodiment shown in FIG. 4 will be described. In the following, first, an overall operation of the present embodiment will be described with reference to FIG. 5 and thereafter a detailed operation will be described with reference to a flow chart of FIG. 6.

Figure 5:
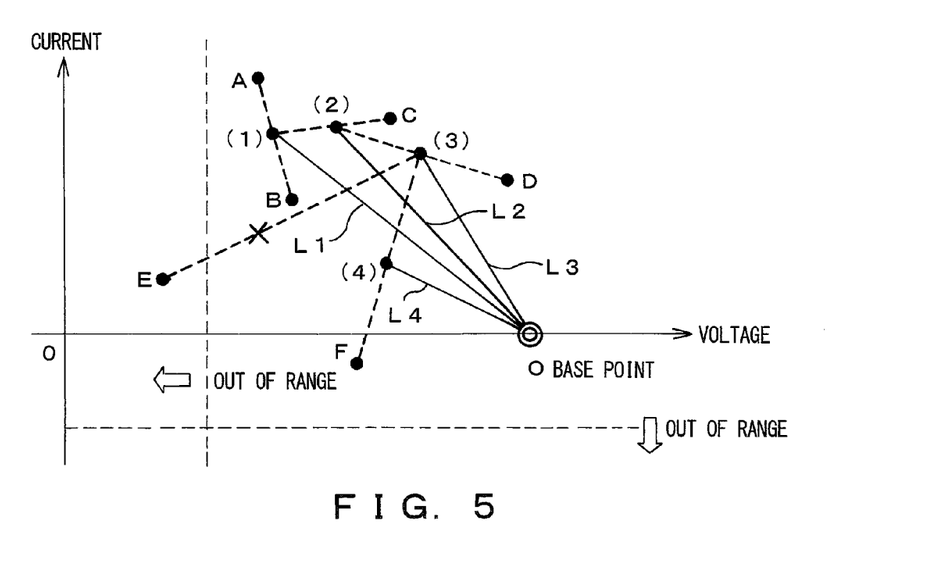
FIG. 5 is a diagram for explaining an outline of an operation of the embodiment shown in FIG. 4.

FIG. 5 is a chart for explaining an overall operation of the present embodiment. In this example, points A to F, which have been measured in this order, are plotted on a current-voltage plane indicating an electric current on its vertical axis and a voltage on its horizontal axis. Also, in this diagram, a base point is provided on a horizontal axis and proper ranges of the voltage and the electric current are indicated with broken lines that are parallel to the horizontal axis and the vertical axis, respectively.

First, in a first measurement, point A is plotted at a point corresponding to the voltage and the electric current measured with the voltage sensor 12 and the current sensor 13. In the second measurement, point B is plotted. Then, a midpoint (1) between point A and point B is obtained and a distance L1 between the midpoint (1) and the base point is obtained.

In a third measurement, point C is plotted, a midpoint (2) between point C and the previous midpoint (1) is obtained, and a distance L2 between the midpoint (2) and the base point is obtained. In a fourth measurement, point D is plotted, a midpoint (3) between point D and the previous midpoint (2) is obtained and a distance L3 between the midpoint (3) and the base point is obtained.

In a fifth measurement, point E is plotted. Here, since point E is out of a proper range, a midpoint and a distance are not obtained and the previous midpoint (3) is retained. In a sixth measurement, point F is plotted. Since point F is in the proper range, a midpoint (4) between point F and the previous midpoint (3) is obtained and a distance L4 between the midpoint (4) and the base point is obtained.

A weighted average of the distances obtained in the aforementioned manner is obtained, and if the weighted average is less than or equal to a predetermined threshold and other parameters described below satisfy conditions for a predetermined period of time or longer, it is determined to have reached the charge acceptance limit and the SOC of the secondary battery 20 at such time is taken as a charge acceptance limit SOC. With the aforementioned process, it can be determined whether or not the secondary battery 20 has reached the charge acceptance limit, and the charge acceptance limit SOC can be obtained.

Figure 6:
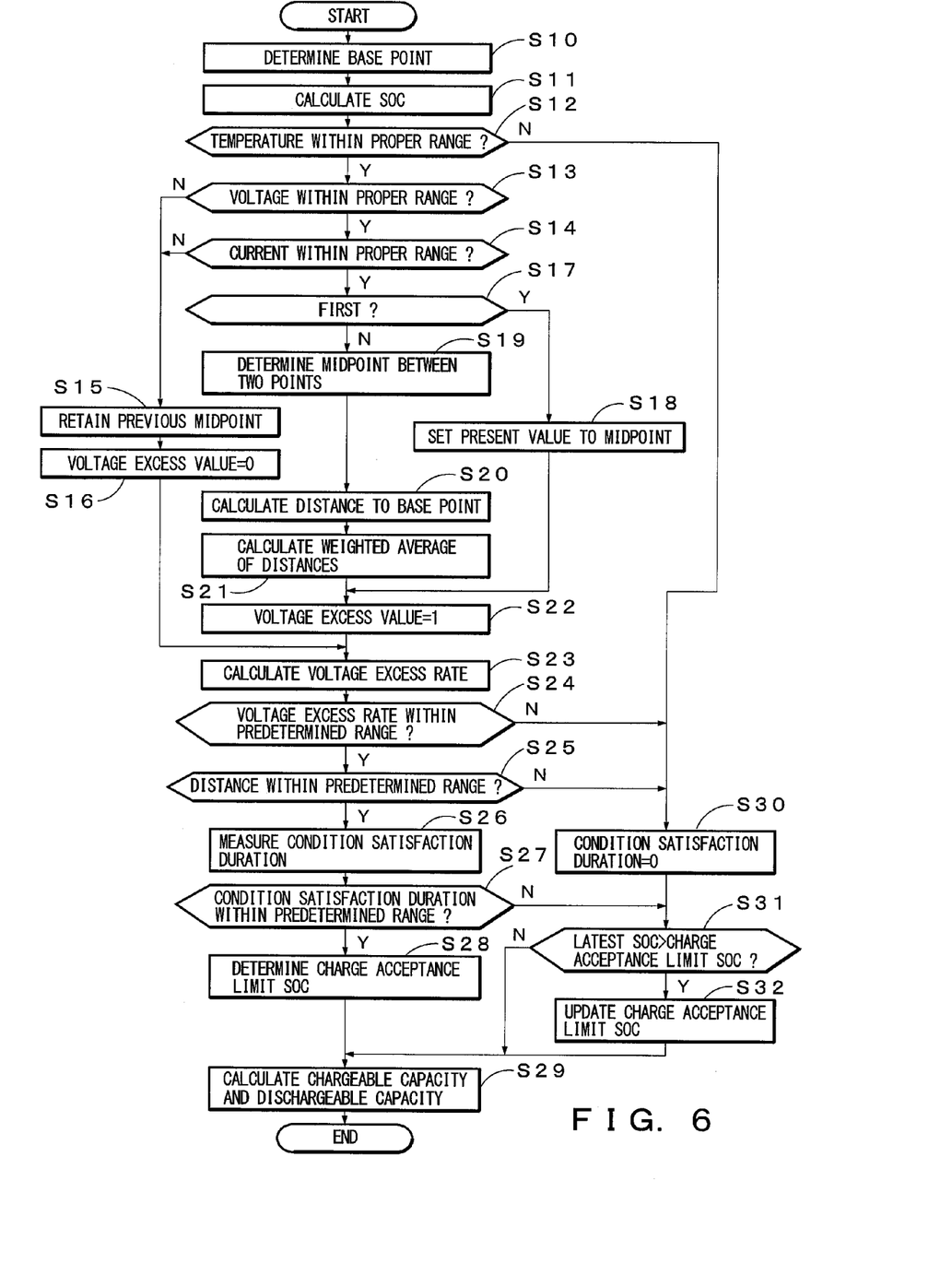
FIG. 6 is a flowchart for explaining an operation of the embodiment shown in FIG. 4.

Next, referring to FIG. 6, a detailed operation of the present embodiment will be described. The flowchart shown in FIG. 6 is achieved by reading out and executing a program 15a from the operation processing unit 11. This flowchart is executed at a predetermined cycle (e.g., a cycle of a few tens of ms). When this flow chart is started, the steps described below are performed.

Step S10: The operation processing unit 11 determines a base point shown in FIG. 5. Specifically, as a base point, for example, a point (14.5V, 0 A) may be taken as the base point. It is to be noted that the secondary battery 20 experiences a drop in the voltage at the charge acceptance limit in accordance with the progress of degradation. As for the lead-acid battery, its life is about two to three years and as it approaches the termination of the life, a voltage at the charge acceptance limit decreases by approximately a few tenths of V. By decreasing the base point by approximately a few tenths of V (e.g., 0.1 to 0.5 V) at the largest depending on (SOH: State of Health) which shows a state of the battery, an optimum base point corresponding to the degradation of the secondary battery 20 can be obtained. Also, rather than moving the base point in accordance with the SOH, it is possible to move the base point depending on a change (increase) in an internal impedance of the secondary battery 20 or to move the base point simply in accordance with an elapse of time. Also, the base point may be moved by measuring a voltage before an engine start while the voltage of the secondary battery 20 is stable, and estimating the degradation based on the change (decrease) in the voltage.

Step S11: The operation processing unit 11 calculates an SOC of the secondary battery 20. A method of calculating an SOC may be a method in which, for example, a mathematical model of the secondary battery 20 or the like is used, but any method may be used.

Step S12: The operation processing unit 11 refers to an output from the temperature sensor 14, determines whether or not the temperature of the secondary battery 20 is within a proper range, and if it is within the proper range (step S12: Yes), proceeds to step S13 and, if not (step S12: No), proceeds to step S30. Specifically, since the secondary battery 20 cannot make an accurate measurement at a temperature of 0° C. or below, if an output from the temperature sensor 14 is higher than 0° C., the process proceed to step S13.

Step S13: The operation processing unit 11 refers to an output from the voltage sensor 12, determines whether or not the voltage of the secondary battery 20 is within a proper range, and if it is determined to be within the proper range (step S13: Yes), proceeds to step S14 and, if not (step S13: No), proceeds to step S15. Specifically, if an output from the voltage sensor 12 is greater than 12.5V, the process proceed to step S14.

Step S14: The operation processing unit 11 refers to an output from the current sensor 13, determines whether or not the electric current flowing in the secondary battery 20 is within a proper range, and if it is determined to be within the proper range (step S14: Yes), proceeds to step S17 and, if not (step S14: No), proceeds to step S15. Specifically, if an output from the current sensor 13 is greater than −15 A, the process proceed to step S17.

Step S15: The operation processing unit 11 retains the previous midpoint. In other words, if the voltage or the current is out of the proper range, such as point E in FIG. 5, the previous midpoint (3) is retained without setting a new midpoint. Thereby, if the current and the voltage become proper in the next process, for example, a midpoint (4) between point F and the retained midpoint (3) is obtained and a distance L4 between the midpoint (4) and the base point is obtained.

Step S16: The operation processing unit 11 sets a voltage excess value which indicates that the voltage is not exceeding a predetermined value (in this example, 12.5 V) is set to "0". This voltage excess value is information expressed in one bit, and this information is used in the calculation of step S23 described below.

Step S17: The operation processing unit 11 determines whether or not it is a first process, and if it is the first process (step S17: Yes), proceeds to step S18, and if not, proceeds to step S19. For example, in a case of point A in FIG. 5, it is the first process and since the previous midpoint does not exist and the distance cannot be obtained, the process proceeds to step S18.

Step S18: The operation processing unit 11 sets the present value to the midpoint. For example, in a case of point A in FIG. 5, since point A which is a present value is set to the midpoint, a midpoint (1) between point A taken as the midpoint and a new point B is obtained in the next process.

Step S19: The operation processing unit 11 determines a midpoint between two points (the previous midpoint and a plotted point corresponding to the present measurement value). Specifically, in the case of a second process indicated in FIG. 5, since point A is set to the midpoint by the process of step S18 in the first process, a midpoint (1) between point A and point B is determined. Also, in a third process, a midpoint (2) between the midpoint (1) and point C is determined.

Step S20: The operation processing unit 11 calculates a distance of the base point from the midpoint. Specifically, in the case of the midpoint (1), a distance L1 between the midpoint (1) and the base point is calculated and in the case of a midpoint (2), a distance L2 between the midpoint (2) and the base point is calculated.

Step S21: The operation processing unit 11 calculates a weighted average of the distances. Specifically, the calculation is performed using the following equation.

[Equation 1]

Latest Average Distance=Previous Average Distance× (1−W)+Latest Distance×W  (1)

Figure 8A:
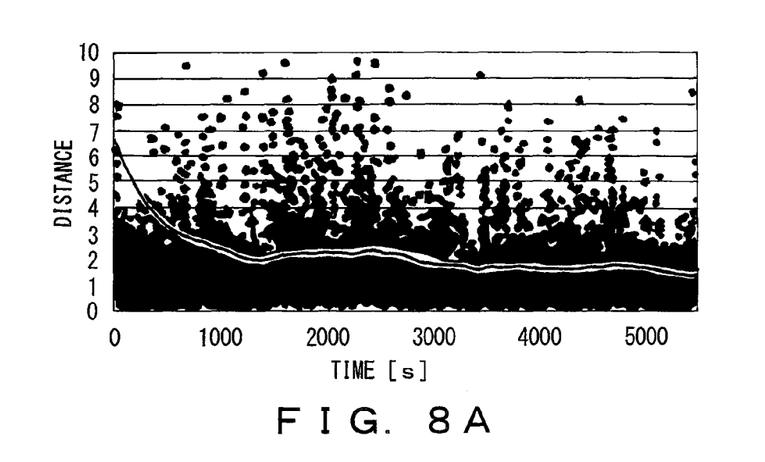
FIGS. 8A to 8C are diagrams showing actual results of the process shown in FIG. 6.
Figure 8B:
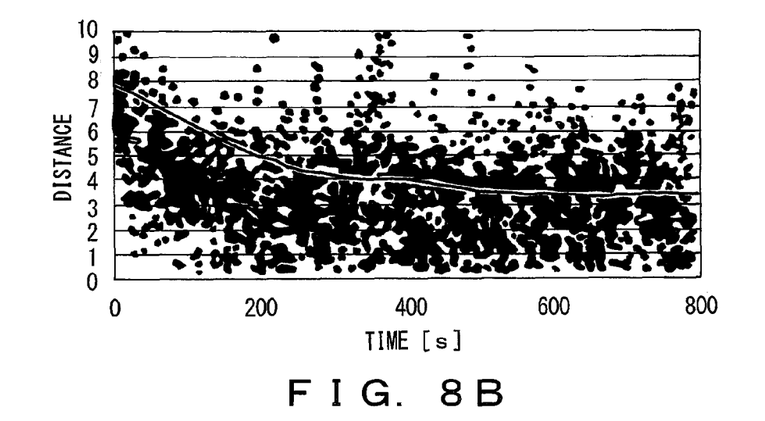
Figure 8C:
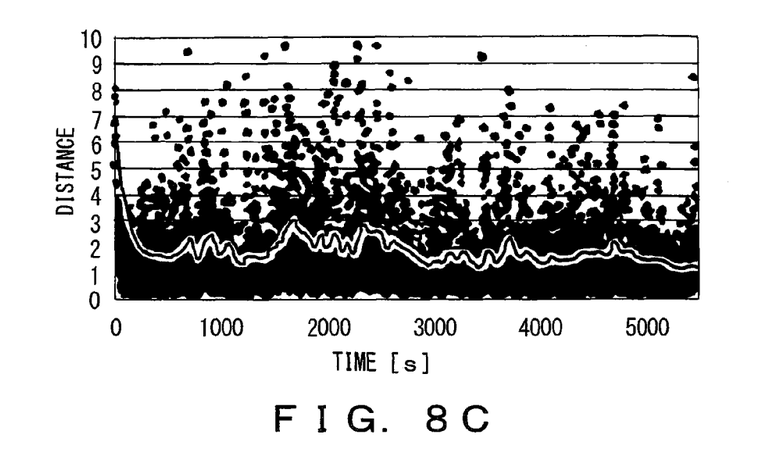

In the equation, W is a weight coefficient and more specifically, W=0.002, for example. The results of calculation for a case where a value of the weight coefficient W is varied will be described later with reference to FIG. 8. A concrete calculation method of the latest average distance will be described. In the second process, the latest distance L1 is calculated but a previous average distance does not exist at that time, and thus in such a case, the latest average distance is obtained by the following equation. In other words, the latest distance L1 becomes the latest average distance.

[Equation 2]

Latest Average Distance=Latest Distance  (2)

In the third process, since L2 is calculated as the latest distance, the following calculation is carried out in accordance with Equation (1), and the latest average distance is calculated: Latest Average Distance=L1×(1−W)+L2×W. In a fourth process, the previously calculated latest average distance is taken as the previous average distance, and Latest Average Distance=Previous Average Distance×(1−W)+L3×W is calculated based on the newly calculated distance L3. In such a manner, by using a weighted average, it will be not necessary to store all distance data and it is possible to reduce a necessary capacity of the storage unit 15.

Step S22: The operation processing unit 11 sets the voltage excess value to "1". In other words, when proceeding to the process of step S22, since the voltage has been determined to be within the proper range in step S13, the voltage is exceeding a predetermined value (in this embodiment, 12.5 V) and the voltage excess value is set to "1".

Figure 7:
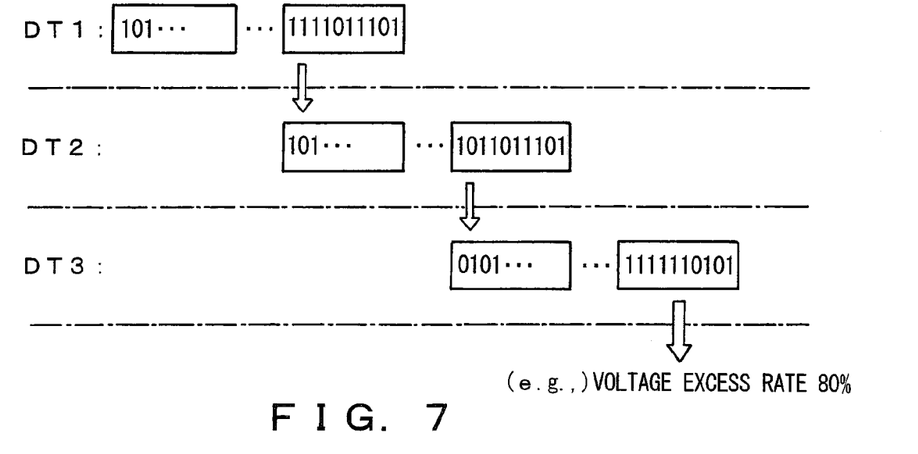
FIG. 7 is a diagram for explaining the details of the voltage excess rate calculation in the flow chart shown in FIG. 6.

Step S23: The operation processing unit 11 calculates a voltage excess rate. Specifically, as shown in FIG. 7, the voltage excess value which is set in step S16 or step S17 is substituted into the MSB (Most Significant Bit) of a 10-bit register DT1. Here, if the register DT1 already has data stored therein, a 1-bit right shift of the register DT1 is carried out before storing new data. When the register DT1 has become full (in a case where data is stored in all of the ten bits), if there are eight or more bits set to "1" among the ten bits, the MSB of a register DT2 is set to "1", and if there are seven or less bits set to "1", the MSB of the register DT2 is set to "0" and all the bits of the register DT1 is cleared. Also, a 1-bit right shift of the register DT2 is carried out. By repeating such an operation, when the register DT2 has become full (in a case where data is stored in all of the ten bits), if there are eight or more bits set to "1" among the ten bits, the MSB of a register DT3 is set to "1" and if there are seven or less bits set to "1", the MSB of the register DT3 is set to "0" and all the bits of the register DT2 is cleared. Also, a 1-bit right shift of the register DT3 is carried out.

Step S24: The operation processing unit 11 determines whether or not the voltage excess rate is within a predetermined range, and if it is determined to be within the predetermined range (step S24: Yes), proceeds to step S25, and if not (step S24: No), proceeds to step S30. Specifically, in a case where eight or more bits among the ten bits of the register DT3 shown in FIG. 7 is "1", proceeds to step S25, and if there are seven or less bits, proceeds to step S30.

Step S25: The operation processing unit 11 determines whether or not the distance is within a predetermined range, and if it is determined to be within the predetermined range (step S25: Yes), proceeds to step S26, and if not (step S25: No), proceeds to step S30. Specifically, in a case where a weighted average value of the distances calculated using Equation 1 in the process of step S21 is, for example, less than "2", it is determines as "Yes" and the process proceeds to step S26, and if not, proceeds to step S30. The determination value "2" is taken by way of example and other values may be used.

Step S26: The operation processing unit 11 refers to an output from the timer 16 and measures a condition satisfaction duration. Specifically, a duration in which the voltage excess value is within a predetermined range in step S24 and the distance is within a predetermined range in step S25 is calculated by referring to an output from the timer 16.

Step S27: The operation processing unit 11 determines whether or not the condition satisfaction duration is within a predetermined range, and if it determined to be within the predetermined range (step S27: Yes), proceeds to step S28, and if not (step S27: No), proceeds to step S31. Specifically, if the condition satisfaction duration measured in step S26 is, for example, 500 seconds or more, determines to be "Yes" and proceeds to step S28 and, if not, proceeds to step S31.

Step S28: The operation processing unit 11 determines the charge acceptance limit SOC. In other words, in case where the conditions in steps S24 and S25 are satisfied continuously for a certain period of time (500 seconds) or more, it is determined that the secondary battery 20 has reached the charge acceptance limit, and the SOC at such an instant (an SOC calculated in step S11) is set to the charge acceptance limit SOC. Also, via an I/F 17, an external device may be informed of the fact that the secondary battery 20 has reached the charge acceptance limit and of the charge acceptance limit SOC.

Step S29: The operation processing unit 11 calculates a chargeable capacity and a dischargeable capacity based on the charge acceptance limit SOC obtained in step S28. Specifically, as shown in FIG. 12, when the charge acceptance limit SOC 51 is determined, the chargeable capacity SOC1 and the dischargeable capacity SOC2 are calculated based the relevant value.

Step S30: The operation processing unit 11 sets the condition satisfaction duration to "0". Specifically, the process proceeds to the process of step S30 in one of a case where the temperature is determined as being not in the proper range in step S12, a case where the voltage excess rate is determined as being not in the proper range in step S24, and a case where the distance is determined as being not in the proper range in step S25, and since the condition is not satisfied continually in such a case, the condition satisfaction duration is reset to "0".

Step S31: The operation processing unit 11 determines whether or not the latest SOC is greater than the charge acceptance limit SOC, and in a case where the following relationship holds: Latest SOC>Charge Acceptance Limit SOC (step S31: Yes), proceeds to step S32, and if not (step S31: No), proceeds to step S29. To be more specific, in a case where, after the charge acceptance limit SOC has been determined in step S28, an SOC having a value larger than this was calculated in step S11, it is expected that the charge acceptance limit SOC is not accurate, and thus it is determined in step S31 whether such a situation has not occurred, and if it has occurred, proceeds to step S32 and updates the charge acceptance limit SOC.

Step S32: The operation processing unit 11 updates the charge acceptance limit SOC with the latest SOC. Then, the process proceeds to the process of step S29.

FIG. 8A is a diagram showing a transition over time of a distance in a case where the aforementioned process was executed on the secondary battery 20 near charge acceptance limit, and FIG. 8B is a diagram showing a transition over time of a distance in a case where the aforementioned process was executed on the secondary battery 20 which is in a chargeable state. In these diagrams, a horizontal axis represents time (seconds) and a vertical axis represents distance. Also, each point represents distance calculated in step S20, and a continuous line indicates an average distance calculated in step S21. As shown in FIG. 8A, in a case where it is near the charge acceptance limit, the continuous line indicating the average distance has a smaller value as compared to a chargeable case shown in FIG. 8B. Also, the average distance shows a smooth transition without fluctuating up and down. Accordingly, with the present embodiment, it is possible to accurately determine the charge acceptance limit of the secondary battery 20.

(F) Variant Embodiment

Each of the aforementioned embodiments is shown by way of example and various other variant embodiments exist. For example, in the aforementioned embodiment, 0.002 is uses as a value of the weight coefficient W in Equation (1), but it is possible to use other values. Generally, it is preferable that the value of the weight coefficient W is not a particularly large value. Specifically, in FIG. 8A, 0.002 is used as the value of the weight coefficient W, but in FIG. 8C, 0.01 is used as the value of the weight coefficient W. By comparing FIG. 8A and FIG. 8C, it can be seen that, in a case where the value of the weight coefficient W is 0.01, the average distance shows a large vertical fluctuation. Therefore, it is preferable to use a value of less than 0.01 as the value of the weight coefficient W.

Further, in the aforementioned embodiments, a measurement value was plotted on a current-voltage plane, a midpoint between the plotted point and the previously obtained midpoint was obtained, and a distance between the midpoint and this base point was obtained, but other method may also be used. Specifically, a distance between the plotted point of the measured value and the base point may be obtained. Alternatively, a midpoint between the plotted point of the measurement value and the plotted point of the previous measurement value may be obtained and then a distance between this midpoint and the base point may be obtained.

Also, in the aforementioned embodiment, a case where the voltage and the current are not within the proper range was excluded from the calculation in step S13 and step S14, but these need not be excluded. Alternatively, in a case where they are not within the proper range, these may be corrected to specified values. Specifically, in a case where the voltage is 12.3 V, this may be corrected to a specified value 12.5 V, or in a case where the current is −16 A, this may be corrected to a specified value −15 A. Here, such a correction may be performed in a case where only one of the voltage value and the current value is out of the proper range, and these measurement values may be excluded from the calculation in a case where both are out of the proper ranges. Alternatively, even in a case where both are out of the proper ranges, these measurement values may both be corrected.

Figure 9A:
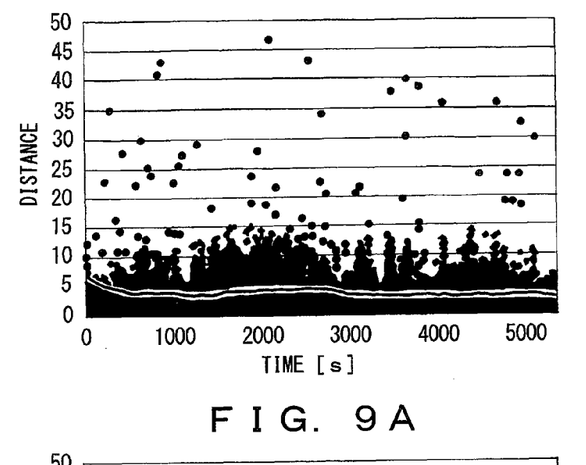
FIGS. 9A to 9D are diagrams showing results of actual measurements according to a variant embodiment.
Figure 9B:
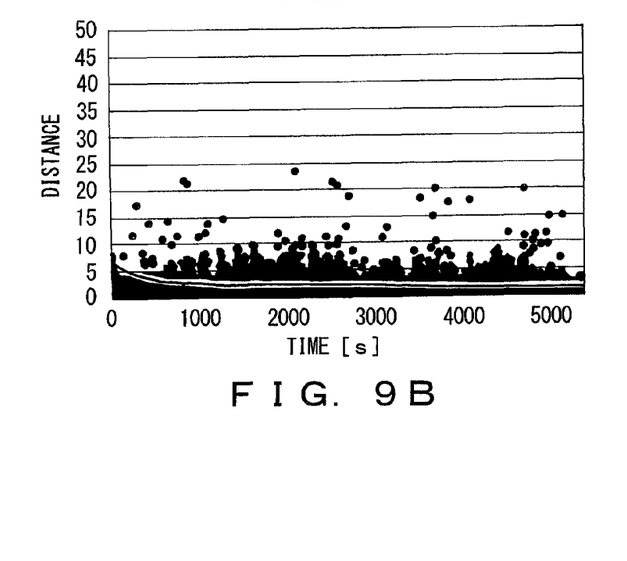
Figure 9C:
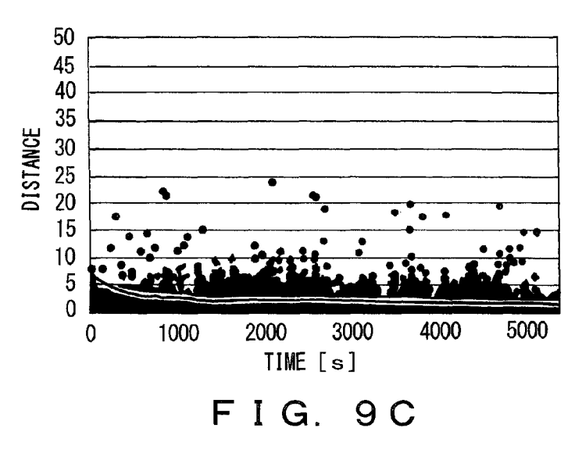
Figure 9D:
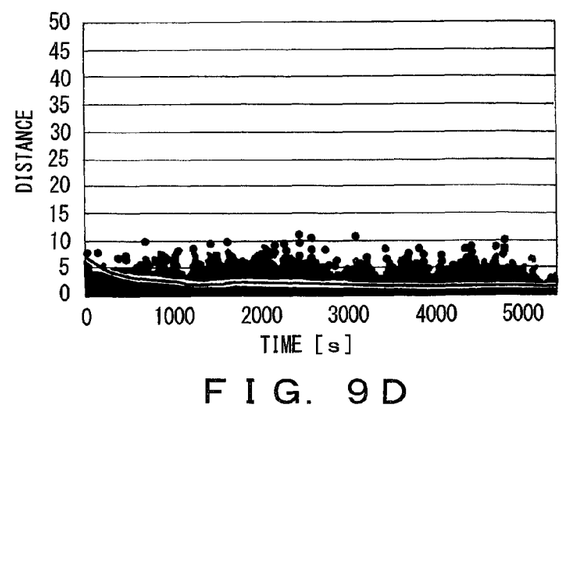
Figure 10A:
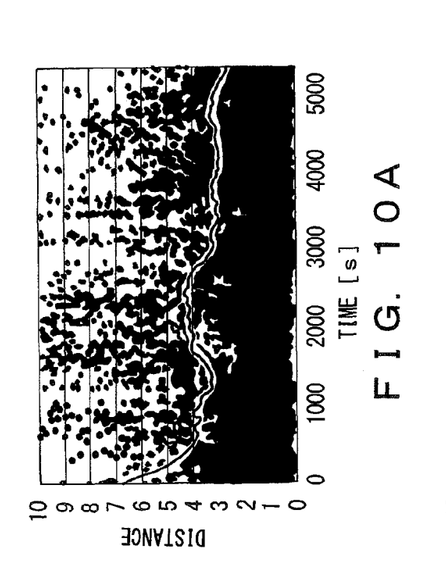
FIGS. 10A to 10D are diagrams showing results of actual measurements according to a variant embodiment.
Figure 10B:
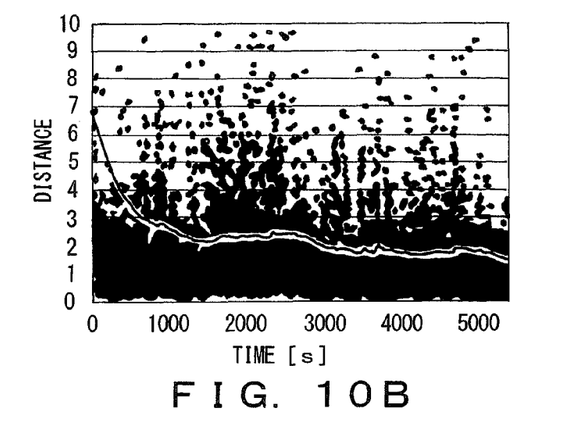
Figure 10C:
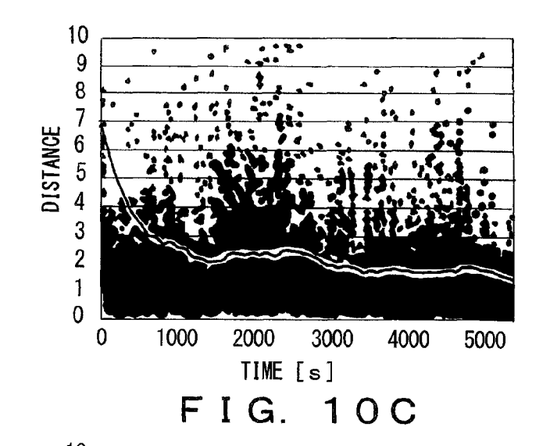
Figure 10D:
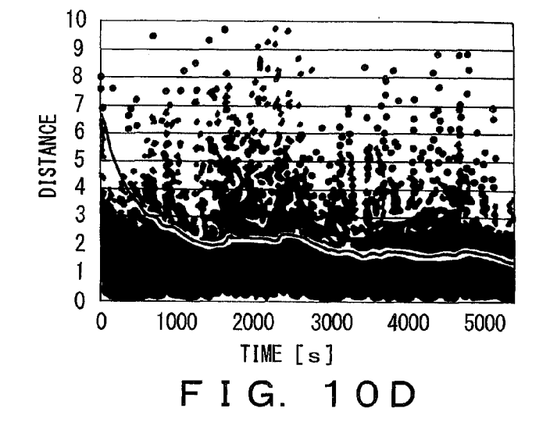

FIGS. 9A to 10D are diagrams showing measurement results according to the aforementioned variant embodiments. In other words, FIG. 9A is a measurement result for a case where a distance between the plotted point of the measurement value and the base point is obtained (e.g., a case where a distance between each of the points A to F and the base point is obtained in FIG. 5); FIG. 9B is a measurement result for a case where a distance of a midpoint between the plotted point of the measurement value and the previous midpoint from the base point is obtained; FIG. 9C is a measurement result for a case where a distance of a midpoint between the plotted point of the measurement value and the previous midpoint from the base point is obtained and where 12.5V or below is excluded; and FIG. 9D is a measurement result for a case where a distance of a midpoint between the plotted point of the measurement value and the previous midpoint from the base point is obtained and where 12.5V or below and −15 A or below are excluded (a case similar to FIG. 6). FIGS. 10A to 10D show results indicating the measurement result for a case where measurement was made under a condition similar to those of FIGS. 9A to 9D with the scale of the vertical axis being changed (the results indicated by changing a range of distance 0 to 50 into a range of distance 0 to 10). Also, the SOC at the time of these measurements is a value near 95. By comparing FIG. 10A with FIG. 10B, it can be seen that the fluctuation of the average distance in the vertical direction is further suppressed when a midpoint is used. Also, by comparing FIG. 9C with FIG. 9D, it can be seen that points plotted at a distance of greater than or equal to "10" are decreased by excluding −15 A or less from the target of calculation. Although an effect of excluding 12.5V or less from the target of calculation is not clear from the comparison between FIGS. 9B and 9C and the comparison between FIGS. 10B and 10C, it is possible to suppress the fluctuation of the distance, specifically in a region where SOC is low, by excluding 12.5 or below from the calculation.

In an embodiment shown in FIG. 6, a distance measurement is not carried out in the first process and a distance measurement is carried out in the second process onwards, however, for example, a distance of point A from the base point shown in FIG. 5 may be obtained and taken as a distance L0 in the first process, and distances L1, L2, . . . may be calculated in a similar manner to the aforementioned case in the second process and onwards. Of course, in such a case, the latest average distance may be obtained in accordance with Equation (2) in the process of step S21, and the latest average distance may be obtained in accordance with Equation (1) in the second process onwards.

Also, in the embodiment shown in FIG. 6, in a case where the temperature condition is not satisfied in step S12, the condition satisfaction duration is simply set to "0", but may be reset with the weighted average value, for example. In such a case, when the temperature condition is satisfied, by determining in step S17 that it is the first process, the distance can be measured accurately again.

Also, the proper ranges of the temperature, the voltage and the current in steps S12 to S14 are described as fixed values, but may be varied in accordance with aging or varied in accordance with the usage environment. Similarly, the determined value of the voltage excess rate, the determined value of the distance and the condition satisfaction duration in steps S24, S25 and S27 may also be variable values in accordance with the aging or usage environment or the like.

Also, in each of the aforementioned embodiments, the measurement values are plotted on the current-voltage plane, but these need not be plotted as long as a distance between the base point and one of the midpoint and the measured point can be obtained. For example, the distance between these points can be obtained by mathematical expressions.

What is claimed is:

1. A charge acceptance limit determination apparatus comprising:
a voltage measuring unit adapted to measure a voltage of a secondary battery;
a current measuring unit adapted to measure an electric current flowing through the secondary battery; and a determining unit adapted to determine whether or not the secondary battery has reached a charge acceptance limit in accordance with a position on a current-voltage plane of a voltage value and a current value that are measured by the voltage measuring unit and the current measuring unit, wherein the determining unit is adapted to determine whether or not the secondary battery has reached a charge acceptance limit based on a distance of a position corresponding to the voltage value and the current value from a predetermined base point on the current-voltage plane.

2. The charge acceptance limit determination apparatus according to claim 1, wherein, when the distance is smaller than a predetermined threshold, the determining unit is adapted to determine that the secondary battery has reached a charge acceptance limit.

3. The charge acceptance limit determination apparatus according to claim 1, wherein, when a weighted average of the distances is smaller than a predetermined threshold, the determining unit is adapted to determine that the secondary battery has reached a charge acceptance limit.

4. The charge acceptance limit determination apparatus according to claim 1, wherein the charge acceptance limit determination apparatus is adapted to reset the predetermined base point depending on degradation of the secondary battery.

5. The charge acceptance limit determination apparatus according to claim 1, wherein the determining unit has a reference value of a voltage value and a reference value of a current value and, when at least one of a measured voltage value and a measured current value is less than or equal to one of the corresponding voltage reference value and current reference value, the charge acceptance limit determination apparatus is adapted to exclude the relevant measured value from a target of the determination.

6. The charge acceptance limit determination apparatus according to claim 1, wherein the determining unit has a proper range for a voltage value and a proper range for a current value, and when one of a measured voltage value and a measured current value is out of the proper ranges, the charge acceptance limit determination apparatus is adapted to correct the relevant measured value to a predetermined specified value.

7. The charge acceptance limit determination apparatus according to claim 1, comprising:
a calculating unit adapted to calculate an SOC indicating a state of charge of the secondary battery,
wherein the charge acceptance limit determination apparatus is adapted to take the SOC calculated by the calculation unit as a charge acceptance limit SOC when the determining unit has determined that the charge acceptance limit has been reached.

8. The charge acceptance limit determination apparatus according to claim 7, wherein, after the charge acceptance limit SOC has been set, when an SOC having a value greater than the charge acceptance limit SOC has been calculated by the calculating unit, the charge acceptance limit determination apparatus is adapted to update the charge acceptance limit SOC with the relevant SOC.

9. A charge acceptance limit determination apparatus comprising:
a voltage measuring unit adapted to measure a voltage of a secondary battery;
a current measuring unit adapted to measure an electric current flowing through the secondary battery; and
a determining unit adapted to determine whether or not the secondary battery has reached a charge acceptance limit in accordance with a position on a current-voltage plane of a voltage value and a current value that are measured by the voltage measuring unit and the current measuring unit, wherein the determining unit is adapted to obtain, on the current-voltage plane, a midpoint between a position corresponding to the voltage value and the current value that are newly measured and a position corresponding to the voltage value and the current value that have been previously measured, the determining unit being adapted to determine whether or not the secondary battery has reached a charge acceptance limit based on a distance of the midpoint from a predetermined base point.

10. The charge acceptance limit determination apparatus according to claim 9, wherein the determining unit is adapted to determine whether or not the secondary battery has reached a charge acceptance limit based on a distance of the predetermined base point from a midpoint between the previously obtained midpoint and a newly obtained midpoint.

11. The charge acceptance limit determination apparatus according to claim 9 wherein, when the distance is smaller than a predetermined threshold, the determining unit is adapted to determine that the secondary battery has reached a charge acceptance limit.

12. The charge acceptance limit determination apparatus according to claim 9, wherein, when a weighted average of the distances is smaller than a predetermined threshold, the determining unit is adapted to determine that the secondary battery has reached a charge acceptance limit.

13. The charge acceptance limit determination apparatus according to claim 9, wherein the charge acceptance limit determination apparatus is adapted to reset the base point depending on degradation of the secondary battery.

14. The charge acceptance limit determination apparatus according to claim 9, wherein the determining unit has a reference value of a voltage value and a reference value of a current value and, when at least one of a measured voltage value is less than or equal to one of the corresponding voltage reference value and current reference value, the charge acceptance limit determination apparatus is adapted to exclude the relevant measured value from a target of the determination.

15. The charge acceptance limit determination apparatus according to claim 9, wherein the determining unit has a proper range for a voltage value and a proper range for a current value, and when one of a measured voltage value and a measured current value is out of the proper ranges, the charge acceptance limit determination apparatus is adapted to correct the relevant measured value to a predetermined specified value.

16. The charge acceptance limit determination apparatus according to claim 9 comprising a calculating unit adapted to calculate an SOC indicating a state of charge of the secondary battery, wherein the charge acceptance limit determination apparatus is adapted to take an SOC calculated by the calculation unit as a charge acceptance limit when the determining means has determined that the charge acceptance limit has been reached.

17. The charge acceptance limit determination apparatus according to claim 16, wherein, after the charge acceptance limit SOC has been set, when an SOC having a value greater than the charge acceptance limit SOC has been calculated by the calculating unit, the charge acceptance limit determination apparatus is adapted to update the charge acceptance limit SOC with the relevant SOC.

18. A charge acceptance limit determination method comprising:

measuring a voltage of a secondary battery to obtain a voltage value;

measuring an electric current flowing through the secondary battery to obtain a current value;

determining whether or not the secondary battery has reached a charge acceptance limit in accordance with a position on a current-voltage plane of the voltage value and the current value wherein said determining whether or not the secondary battery has reached a charge acceptance limit is based on a distance of a position corresponding to the voltage value and the current value from a predetermined base point on the current-voltage plane.

* * * * *